United States Patent [19]

Ruckert et al.

[11] Patent Number: 4,506,003

[45] Date of Patent: Mar. 19, 1985

[54] POSITIVE-WORKING RADIATION-SENSITIVE MIXTURE

[75] Inventors: Hans Ruckert, Wiesbaden; Gerhard Buhr, Königstein; Hartmut Steppan, Wiesbaden, all of Fed. Rep. of Germany

[73] Assignee: Hoechst Aktiengesellschaft, Frankfurt am Main, Fed. Rep. of Germany

[21] Appl. No.: 551,025

[22] Filed: Nov. 14, 1983

Related U.S. Application Data

[63] Continuation of Ser. No. 274,402, Jun. 17, 1981, abandoned.

[30] Foreign Application Priority Data

Jun. 21, 1980 [DE] Fed. Rep. of Germany ....... 3023201

[51] Int. Cl.$^3$ ................................................ G03C 1/68
[52] U.S. Cl. ..................................... 430/270; 430/271; 430/296; 430/311; 430/275; 430/905; 430/910; 204/159.11; 204/159.14
[58] Field of Search ............... 430/270, 271, 296, 311, 430/905, 910; 204/159.11, 159.14

[56] References Cited

U.S. PATENT DOCUMENTS

| | | |
|---|---|---|
| 3,634,082 | 1/1972 | Christensen . |
| 3,779,778 | 12/1973 | Smith et al. . |
| 3,917,483 | 11/1975 | Limburg et al. ................... 430/270 |
| 4,093,464 | 6/1978 | Ruckert et al. . |
| 4,101,323 | 7/1978 | Buhr et al. . |
| 4,148,654 | 4/1979 | Oddi . |
| 4,189,320 | 2/1980 | Hsieh . |
| 4,189,323 | 2/1980 | Buhr . |

FOREIGN PATENT DOCUMENTS

| | | |
|---|---|---|
| 1622301 | 2/1972 | Fed. Rep. of Germany . |
| 2236941 | 2/1974 | Fed. Rep. of Germany . |
| 2617088 | 11/1976 | Fed. Rep. of Germany . |
| 2733267 | 1/1978 | Fed. Rep. of Germany . |
| 2718254 | 11/1978 | Fed. Rep. of Germany . |

*Primary Examiner*—Jack P. Brammer
*Attorney, Agent, or Firm*—Schwartz, Jeffery, Schwaab, Mack, Blumenthal & Koch

[57] ABSTRACT

A positive-working radiation-sensitive mixture is described which is composed of a compound having at least one C—O—C bond which can be split by acid, a compound which forms a strong acid when irradiated, a binder which is insoluble in water and soluble in aqueous-alkaline solutions, and a resin having solubility properties which differ from those of the binder and which is selected from (1) a polyurethane resin obtained from an organic isocyanate and a polymer which contains hydroxyl groups, (2) a polyvinyl alkyl ether, (3) an alkyl acrylate polymer, or (4) a hydrogenated or partially hydrogenated derivative of colophony. As a result of the resin additives, photoresist layers are obtained which have good adhesion to the support, good flexibility, good latitude in developing and good resolution.

13 Claims, No Drawings

POSITIVE-WORKING RADIATION-SENSITIVE MIXTURE

This is a continuation, of application Ser. No. 274,402, filed June 17, 1981, now abandoned.

BACKGROUND OF THE INVENTION

The present invention relates to a positive-working, radiation-sensitive mixture, and more particularly to such a mixture which is rendered soluble by irradiation, and which contains as the essential constituents, (a) a compound having at least one C—O—C bond which can be split by acid, (b) a compound which forms a strong acid when irradiated, and (c) a binder which is insoluble in water and soluble in aqueous-alkaline solutions. A mixture of this type is suitable for the preparation of printing plates and photoresists. Mixtures comprised of these basic constituents are described, for example, in U.S. Pat. No. 3,779,778, No. 4,101,323 and No. 4,189,323, in German Offenlegungsschriften Nos. 27 18 254 and No. 29 28 636 and in published European Patent Applications Nos. 0,006,626 and 0,006,627.

Although it is mentioned in these printed publications that other polymeric substances can also be added in addition to the alkali-soluble binders, nevertheless, alkali-soluble binders, in particular phenolic resin novolaks, are described virtually exclusively in the illustrative examples.

Other binders or resins are, however, already known as additives for positive-working radiation-sensitive or light-sensitive mixtures based on o-quinone-diazides. Thus, German Pat. No. 16 22 301 describes the addition of polyvinyl alkyl ethers, German Offenlegungsschrift No. 22 36 941 describes the addition of acrylic resins, German Offenlegungschrift No. 27 33 267 describes the addition of terpene resins and German Offenlegungschrift No. 26 17 088 describes the addition of reaction products of organic isocyanates with novolaks to o-quinone-diazide layers, which additionally can contain alkali-soluble novolaks.

In spite of the numerous proposals, some of which were made a considerable time ago, for the improvement and modification of the properties of positive-working light-sensitive layers based on o-quinone-diazides for the most diverse applications, these layers still do not yet meet all the requirements.

Specifically, in the case of positive photoresist compositions for micro-electronic applications, where a high resolution and exact line definition, even after baking steps, are of particular importance, resin additions of the types mentioned have been unable to gain acceptance. Even polyvinyl alkyl ethers are still not used very widely, in spite of numerous efforts in microelectronics to introduce resists containing these additives into the mass production of chips. A main obstacle appears to be the fact that disadvantages, for example, a loss of sharpness after baking, can arise in diazo layers after the addition of these resins during certain working steps under production conditions.

SUMMARY OF THE INVENTION

It is therefore an object of the present invention to provide an improved positive-working radiation-sensitive mixture.

Another object of the invention is to modify the mechanical and chemical properties of positive-working radiation-sensitive layers, based on the compounds which can be split by acid, and the photolytic acid donors, as mentioned at the outset, in such a way that they can be adapted to the most diverse applications.

It is also an object of the present invention to provide an improved process for the preparation of a relief image.

In accomplishing the foregoing objects, there has been provided, in accordance with one aspect of the present invention, a positive-working radiation-sensitive mixture, comprising a compound having at least one C—O—C bond which can be split by acid; a compound which forms a strong acid when irradiated; a binder which is insoluble in water and soluble in an aqueous-alkaline solution; and at least one resinous material having solubility properties which differ from those of said binder, wherein the resinous material comprises either a polyurethane resin obtained from an organic isocyanate and a polymer which contains hydroxyl groups, a polyvinyl alkyl ether, an alkyl acrylate or methacrylate polymer or copolymer thereof, a hydrogenated or partially hydrogenated derivative of colophony, or a mixture of these resinous materials.

In accordance with another aspect of the present invention, there has been provided a process for the preparation of a relief image, comprising the steps of laminating a light-sensitive material comprised of a temporary support film and a light-sensitive thermoplastic layer comprising a light-sensitive mixture as defined above to a support material under the action of pressure and heat, imagewise exposing the light-sensitive layer, and after the temporary support film has been peeled off, washing out the exposed layer areas by means of an aqueous-alkaline developer solution.

Further objects, features and advantages of the present invention will become apparent from the detailed description of preferred embodiments which follows.

DETAILED DESCRIPTION OF PREFERRED EMBODIMENTS

The starting point of the invention is a positive-working radiation-sensitive mixture which is composed of (a) a compound having at least one C—O—C bond which can be split by acid, (b) a compound which forms a strong acid when irradiated, and (c) a binder which is insoluble in water and soluble in aqueous-alkaline solutions.

The radiation-sensitive mixture according to the invention comprises, additionally, (d) at least one resin, the solubility properties of which differ from those of the binder (c) and which comprises (d1) a polyurethane resin obtained from an organic isocyanate and a polymer which contains hydroxyl groups, (d2) a polyvinyl alkyl ether, (d3) an alkyl acrylate polymer or (d4) a hydrogenated or partially hydrogenated derivative of colophony.

It has been found that, in the indicated types of positive-working layers, the additional resins frequently have effects which are very different from those in layers based on quinone-diazides. In part, this results from the very different mechanical properties of the basic constituents of the two types of layers. While quinone-diazides in combination with phenolic resin novolaks usually actually increase the brittleness of the layer, ortho-carboxylic acid derivatives, acetals, acyliminocarbonates and enol ethers normally have the opposite effect. These substances frequently are oily or low-melting components and, therefore, themselves already contribute to the softness, flexibility and a reduction in brittleness.

While o-quinone-diazide/novolak layers in most cases have a turbid appearance because of the crystalline to amorphous properties of the diazo compounds and the interaction of the latter with this resin, layers of the type according to the invention are completely clear. In the case of pure quinone-diazide/novolak layers, problems can arise regarding the adhesion to silicon wafers, in particular if the surfaces are doped. This can require special pretreatment steps, as can be seen, for example, from U.S. Pat. Nos. 3,549,368 and 3,586,554 and German Offenlegungsschrift No. 26 17 914.

It was thus surprising that the resin additives, already known for quinone-diazide layers, produce completely different effects when combined with compounds which can be split by acid. It was not foreseeable that an addition of, for example, a polyvinyl ethyl ether can in this case improve the developing latitude, that is to say the difference between developing time and resistance to the developer. Furthermore, in contrast to the effect on diazo layers, the polyvinyl ethyl ether even enhances the properties of the layer on baking, that is to say, it reduces the tendency to flow and it increases the edge acuity.

While exposed and developed layers which are composed only of novolak, ortho-ester compound and acid-forming starter, can, in spite of good adhesion to silicon wafers, have holes in unexposed areas (the cause of which cannot yet be clearly explained), this defect disappears when the resins according to the present invention are added. Since it was not possible to eliminate the holes, which are formed only during developing, by the addition of a wetting agent to the layer, it is assumed that an interaction (hydrogen bridges) which favors the formation of a film takes place between the polyvinyl ethyl ether and the novolak resin.

This is supported by the probability that an interaction between a compound which can be split by acid and a novolak resin would be weaker than the known, relatively extensive formation of adducts or similar aggregates between o-naphthoquinone-diazide and a novolak. To the extent that they can be compared, corresponding non-diazo layers are more advantageous than diazo layers, not only with respect to the resistance to developer, but also with respect to the quantity of added resin, which can be incorporated in order to improve other properties of the layer, without a substantial deterioration in the copying properties.

The quantitative proportion of added resin, relative to the non-volatile constituents of the mixture, is between about 1 and 50% by weight, depending on the type of the resin and the other constituents of the layer.

In the case of a polyvinyl alkyl ether, the proportion of added resin can be from about 2 to 40%, preferably from about 5 to 25%. In the case of polyvinyl alkyl ethers having longer-chain alkoxy radicals in the side positions, for example, polyvinyl isobutyl ether, the most advantageous quantity added is lower than in the case of polyvinyl ethyl ether. If polyvinyl methyl ether is added to the new layers, it is surprisingly observed that not only the adhesion and softness, but above all the elastic/film-forming properties are outstanding. Thus, when polyvinyl methyl ether is added to positive dry resist layers based on compounds which can be split by acid, even large holes drilled in through-hole plated circuits are covered by the resist layer (tenting). Depending on the substance which can be split by acid and on the layer thickness, up to 40% of polyvinyl methyl ether can be present in the layer, with good results. The maximum quantity is reached when the resistance to developer is markedly reduced, or other limiting factors, for example, atmospheric humidity, adversely affect the result of copying.

Good technological results are also obtained with the addition of polyacrylate resins, in particular polyethyl acrylates, which, like polyvinyl ethyl ethers, render the layer elastic and stronger, without adversely affecting the copying properties. Polyacrylate resins are preferably to be understood as the lower polyacrylic and polymethacrylic acid alkyl esters; however, copolymers of these are also suitable. The acrylate resins even improve the resistance to developer, since their high-molecular constituents reduce the rate of dissolution of unexposed parts of the layer. In general, their quantity can be from about 1 to 20%, preferably from about 5 to 15% by weight. In the case of greater quantitative proportions, there is a risk that exposed parts of the layer can become detached in the form of flakes, and this can lead to undesired depositions at other points. In the manufacture of dry resist layers, this must be compensated by other means and, in the new positive systems which can be varied very widely, this is indeed possible by an appropriate selection of the compound which can be split by acid.

In addition, to a surprisingly greater extent than in the case of diazo layers, and to a greater extent than with the polyvinyl alkyl ethers which are themselves tacky, the adhesion to metal surfaces can be improved when polyacrylate resins are used, and/or the behavior of the positive layers when being separated from polyester films and polyolefin films can be controlled. It is thus possible to optimize the adhesion to such an extent that mixtures of this type can be cast as solutions onto polyester films, dried and then cleanly transferred (laminated) to copper. Even with optimized diazo layers, this method succeeds only when specially pretreated polyester films are used, as is described, for example, in German Offenlegungsschrift No. 24 03 054.

The best results are obtained with polyethyl acrylate, whereby from about 2 to 12% are added when it has a low viscosity, and from about 1 to 6% are added when it has a high viscosity. Generally, relatively low-molecular polymers are preferred.

Polybutyl acrylate, polybutyl methacrylate and copolymers thereof can also be used, albeit with a less pronounced effect. Mixtures of polyvinyl alkyl ethers and polyalkyl acrylates permit a further fine adjustment of the desired properties, without an adverse synergistic effect occurring.

Finally, during experiments to improve the new light-sensitive layers for different applications, it has additionally been found that advantageous effects can also be obtained by an addition of terpene resins, that is to say derivatives of colophony. These can be added in amounts of from about 3 to 50%, preferably from about 7 to 45% by weight. Resins of this type have been used for a long time in lacquer technology, since they are based on inexpensive natural raw materials and are available in many variations for numerous applications.

The use of resins of this type in positive diazo layers has been described in the past (see e.g., German Offenlegungsschrift No. 27 33 267). Among the large number of resins, known as additives for layers of this type, the resins of this group, in combination with the compounds which can be split by acid, are very advantageously distinguished with respect to the quality of the coating, resistance to developer and adhesion, evidently because they are also readily compatible with the other constituents of the layer, in particular the compounds which can be split by acid. Even resins which themselves have a solid to crumbly consistency can have an advantageous influence on the properties of the layer.

A review of the available colophony resins is given by Karsten: Lackrohstoff-Tabellen (Tables of Lacquer Raw Materials), published by Vincentz, Hannover, the disclosure of which is hereby incorporated by reference. Those resins are preferred which have already proved suitable for the preparation of printing inks and hot-melt adhesives. They can be combined with the other resins mentioned.

Hydrogenated and partially hydrogenated colophony derivatives, in particular terpene resin esters, such as the methyl esters, glycerol esters, triethylene glycol esters or alkyd esters of terpene resins, are preferred, since they are more resistant to oxidation. The most advantageous combinations are determined in detail by experiments, depending on the intended use. Thus, terpene resins are less suitable for micro-electronic resists and electroplating resists, even though they can also be used for these purposes. They are particularly suitable as additives in layers for products, such as dry resists and color proofing films, where baking or tempering processes of the layer hardly occur, or not at all, but instead the flexibility and adhesion of the layer are important.

Finally, polyurethane resins are also suitable as additive resins. These are obtained by reacting organic monoisocyanates or polyisocyanates with polymeric hydroxy compounds. Examples of polymeric hydroxy compounds which can be used are polyethers or polyesters, and preferably phenolic resins, in particular novolaks. In general, the polyurethanes can be added in quantities of from about 3 to 30, preferably from about 5 to 20% by weight. In this case, it is possible and advantageous to use for the reaction with the isocyanate the same novolak which is also contained in an unmodified form in the layer. Thus, the resin mixture used in this case can be a reaction product of novolak and isocyanate, which still contains a relatively large excess of unconverted novolak.

The light-sensitive mixtures according to the invention also contain a significant proportion of an alkali-soluble resin, preferably a novolak. The quantity is between about 20 and 90%, preferably between about 45 and 80% by weight of the quantity of the non-volatile constituents. The total quantity of alkali-soluble resin and additive resin is between about 25 and 91%, preferably between about 50 and 85% by weight. The quantity of the compound which can be split by acid is from about 9 to 75 and preferably from about 15 to 50% by weight and the quantity of the photolytic acid donor is from about 0.1 to 10 and preferably from about 0.2-5% by weight. These constituents are described in detail in the printed publications quoted above, to which reference is made here and the disclosures of which are hereby incorporated by reference. The orthocarboxylic acid derivatives which are described in U.S. Pat. No. 4,101,323 and German Offenlegungsschrift No. 29 28 636, and the polyacetals which are described in German Offenlegungschrift No. 27 18 254, equivalent to U.S. Pat. No. 4,247,611 are used with particular advantage, i.e., polyacetals wherein each alpha-carbon atom of the alcoholic constituent of the acetal groupings is aliphatic.

The light-sensitive mixtures can additionally also contain soluble or finely divided dispersible dyes and also, depending on the intended application, UV absorbers. Triphenylmethane dyes, in particular, in the form of their carbinol bases, have proved to be particularly suitable dyes. The most advantageous quantitative proportions of the components can readily be determined, in an individual case, by preliminary experiments.

Suitable solvents for the mixture of substances according to the invention are ketones, such as methyl ethyl ketone, chlorinated hydrocarbons, such as trichloroethylene and 1,1,1-trichloroethane, alcohols, such as n-propanol, ethers, such as tetrahydrofuran, alcohol ethers, such as ethylene glycol monoethyl ether, and esters, such as butyl acetate. Mixtures can also be used which, for special purposes, can also additionally contain solvents, such as acetonitrile, dioxane or dimethylformamide. In principle, any solvents can be used which do not irreversibly react with the components of the layer.

The selection of the solvents must, however, be matched to the intended coating process, the layer thickness and the drying apparatus. Thin layers of up to about 5 $\mu$m for test quantities are preferably applied on a whirler or spin-coater by pouring them on. Using solutions having a solids content of up to about 40%, layer thicknesses of more than 60 $\mu$m can be obtained in this way by a single application or by using a wire-bar. For coating on both sides, dip-coating is preferred, and rapid drying can be achieved by the use of low-boiling solvents. Web coating is carried out by application using rollers, slot dies or by spraying, and individual plates can be coated with the aid of a curtain-coater.

Preferred supports for layers of more than 10 $\mu$m thickness are plastic films which then serve as temporary supports for the transfer layers. For this purpose and for color proofing films, polyester films, for example those composed of polyethylene terephthalate, are particularly preferred. Polyolefin films, such as polypropylene, however, are likewise suitable. The layer supports used for layer thicknesses of less than about 10 $\mu$m are in most cases metals. The following can be used for offset printing plates: mechanically or electrochemically roughened and, if appropriate, anodized aluminum which additionally can also have been chemically pretreated, for example, with polyvinylphosphonic acid, and also multi-metal plates with Cu/Cr or brass/Cr as the top layer. For letter press printing plates, the layers according to the invention can be applied to zinc plates or magnesium plates for the powderless etching process, and they can also be applied to plastics, such as polyoxymethylene, which can be etched. Due to their good adhesion and etch resistance on copper or nickel surfaces, the layers according to the invention are suitable for gravure printing forms or screen printing forms. The mixtures according to the invention can likewise be employed as photoresists in chemical milling, and a large number of special substrates for this purpose is commercially available.

Moreover, wood, textiles and the surfaces of many materials can be coated. These surfaces are advantageously provided with an image by projection and are resistant to the action of alkaline developers.

Finally, coating can be effected directly or by dry layer transfer from a temporary support film to printed circuit board materials which are composed of insulating plates having a copper coating on one side or on both sides, to glass or ceramic materials which, if appropriate, have been subjected to an adhesion-promoting pretreatment, for example, thin metal layers on $Al_2O_3$/ceramic plates for microstrip circuitry in microwave technology.

The thinnest coatings, down to less than 1 $\mu$m are applied for microelectronics to silicon wafers, the surfaces of which can carry oxide layers or nitride layers of various thicknesses and can be p-doped or n-doped. Especially in this field of application, the mixtures according to the invention display their special properties, such as adhesion, resistance to flow on baking, and hence resolution, dimensional stability and resistance to plasma etching.

For drying after coating, the customary equipment and conditions can also be used. Temperatures of about 100° C., and up to 120° C. for short periods, are tolerated without a loss in radiation sensitivity.

For exposure, the customary copying equipment, such as tubular lamps, pulsed xenon lamps, metal halide-doped high-pressure mercury vapor lamps and carbon arc lamps can be used. Furthermore, exposure in conventional projection and enlarging apparatus under the light of metal filament lamps, and contact exposure with ordinary incandescent bulbs are possible. The exposure can also be carried out with the coherent light of a laser. Short-wave lasers of appropriate power, for example argon lasers, krypton ion lasers, dyestuff lasers and helium/cadmium lasers, which emit between 300 and 600 nm, are suitable for the purposes of the present invention. The laser beam is controlled by means of a preset programmed line-scanning and/or screen-scanning motion.

Exposure with electron beams is a further possibility for producing an image. Electron beams can thoroughly decompose and crosslink the mixture according to the invention, in the same way as many other organic materials, so that a negative image is formed when the non-irradiated portions are removed by solvents or by exposure without an original, and developing. If the intensity of the electron beam is relatively low and/or the scanning speed is relatively high, however, the electron beam effects a differentiation in the direction of higher solubility, that is to say the irradiated portions of the layer can be removed by the developer.

The layer which has been imagewise exposed or irradiated can be removed by means of the same developers which are used for the known layers based on compounds which can be split by acid, or the copying conditions for the new layers can advantageously be matched to the known auxiliaries, such as developers and programmed spray-development devices. The aqueous developer solutions can, for example, contain alkali metal phosphates, silicates or hydroxides and also wetting agents as well as relatively small proportions of organic solvents. In certain cases, solvent/water mixtures can also be used as the developer. The selection of the most advantageous developer can be determined by experiments with the particular layer used. If necessary, developing can be mechanically assisted.

In the following text, examples of the light-sensitive mixtures according to the invention are given. Unless otherwise stated, the percentage ratios and quantitative ratios are to be understood as weight units. The relationship of parts by weight (p.b.w.) and parts by volume (p.b.v.) is the same as that of $g/cm^3$.

EXAMPLE 1

To prepare microelectronic circuit elements of high packing density, a commercially available silicon disk, which had been polished in the conventional manner and provided with a 0.2 $\mu$m thick $SiO_2$ layer by oxidation, is coated with the following positive copying lacquer.

18 parts by weight of a cresol/formaldehyde novolak having a softening range of 105°–120° C. according to DIN 53,181, 9.5 parts by weight of a triethylene glycol-bis-diphenoxymethyl ether, 1.2 parts by weight of 2-(4-ethoxynaphth-1-yl)-4,6-bis-trichloromethyl-s-triazine, and 1.3 parts by weight of a polyethyl acrylate of low viscosity (Plexisol B 574)

are dissolved in 70 parts by weight of a solvent mixture composed of ethylene glycol ethyl ether-acetate, butyl acetate and xylene in a ratio of 8:1:1 and the solution was filtered through a 0.5 $\mu$m filter.

On spin-coating of the carrier, at 9,000 r.p.m., a resist layer of about 1.2 $\mu$m thickness is obtained, which is dried for an additional 10 minutes at 90° C. in a circulating air oven. After cooling and conditioning to defined climatic conditions of 23° C. and 40–50% relative humidity, the resist layer is exposed for about 1 second in a wafer contact-exposure apparatus under a commercially available chromium mask having highly resolved test areas, using a 200 watt Hg high-pressure lamp.

Developing is carried out at 25° C. in a moving developer composed of 2.67% of sodium metasilicate $\times 9H_2O$, 1.71% of trisodium phosphate $\times 12H_2O$ and 0.17% of monosodium phosphate, dissolved in 95.45% of fully desalinated water.

The disk is then rinsed with fully desalinated water and blown dry with nitrogen.

By virtue of the film-forming properties of the additive resin, the adhesion and etch resistance on etching with $NH_4F$-buffered hydrofluoric acid are markedly improved. It is possible further to enhance this behavior by increasing the proportion of additive resin up to about twice the quantity stated. If, in doing this, a tendency to fog appears, depending on the layer thickness, drying and exposure, it is possible to eliminate this tendency by increasing the concentration of the developer, without impairing the effect achieved by the increased quantity of resin.

Similar results are obtained when, instead of the aromatic-aliphatic ortho-ester used, the same quantity of an aliphatic ortho-ester, namely the bis-(2,5-diethyl-5-butyl-1,3-dioxan-2-yl)ether of triethylene glycol, is used.

EXAMPLE 2

A positive dry resist layer of 50 $\mu$m thickness is applied to a 25 $\mu$m thick polyester film, which has been pretreated with trichloroacetic acid/polyvinyl alcohol and is laminated with a polyethylene cover film. The dry resist layer is prepared by coating with the following solution:

- 34.5 parts by weight of ethylene glycol monomethyl ether,
- 21.0 parts by weight of methyl ethyl ketone,
- 27.5 parts by weight of the novolak as in Example 1,
- 5.4 parts by weight of polyglycol 2000,
- 9.7 parts by weight of the polyacetal obtained from 2-ethyl-butyraldehyde and triethylene glycol,
- 0.3 part by weight of 2-[4-(2-ethoxyethoxy)-naphth-1-yl]-4,6-bis-trichloromethyl-s-triazine,
- 1.9 parts by weight of a commercially available coating aid based on silicone, and
- 0.02 part by weight of crystal violet base.

This dry resist layer is, after peeling off the protective film, applied to a copper-laminated plate of insulating material by lamination, under the action of pressure and heat, in a commercially available laminator for the production of printed circuit boards. After the support film has been peeled off from the coated printed circuit board material, which has cooled down in the meantime, the latter is exposed for 50 seconds under a corresponding original at a distance of 140 cm with a 5 kW metal halide lamp. It is also possible to expose through the support film. Preferably, however, the dry resist layer is exposed in direct contact with the original and after further drying, for example, for 10 minutes at 80° C. Subsequently, the layer is developed in a spray apparatus with the following developer solution:

- 0.6% of NaOH,
- 0.5% of sodium metasilicate×5H$_2$O,
- 1.0% of n-butanol, and
- 97.9% of fully desalinated water.

By a stepwise replacement of the polyglycol by polyethyl acrylate, the softness of the layer can be adjusted to a lower value, as desired, and the resistance to developer as well as the quality as an electroplating resist can be improved. If drying during the coating step is not very vigorous, polyester without the pretreatment mentioned can be used as the support film.

EXAMPLE 3

Using ethylene glycol monomethyl ether as the solvent, a 25 μm thick positive dry resist layer which is composed of

- 65.0% of the novolak as in Example 1,
- 19.5% of a poly-ortho-ester, prepared by a polycondensation reaction of trimethyl orthoformate with 2-ethyl-2-hydroxymethyl-4-oxa-octane-1,8-diol, (mean molecular weight 1470),
- 0.7% of the triazine derivative indicated in Example 1,
- 0.06% of crystal violet base,
- 5.9% of a vinyl acetate/crotonic acid copolymer (95:5), and
- 5.9% of a polyester obtained from adipic acid and propane-1,2-diol is applied to the support film mentioned in Example 2.

For the preparation of through-hole plated printed circuit boards, this dry resist is laminated onto a commercially available base material which is copper-laminated on both sides and which, depending on the circuit, has been provided with bores of up to 2 mm diameter. Subsequently, the support film is peeled off, and the layer is dried further for a short period and exposed and developed as in Example 1. In this case, the plate, coated on both sides, is also exposed on both sides, and it is developed by spraying simultaneously from both sides in an appropriate spray-developing machine.

Without addition of the copolymer and the plasticizer, the resist is too weak with respect to its film properties. The stability of the resist skin over the drilled holes with these additives on spray-developing is already good in the case of holes of 0.5 mm diameter. When this resin and the plasticizer are replaced, in stages or completely, by polyvinyl methyl ether (Lutonal M 40) as the plasticizing resin, positive dry resists are obtained which are excellently suitable for covering drilled holes of up to 2 mm diameter.

When the proportion of polyvinyl methyl ether is increased to 20% and the novolak content of the layer is reduced at the same time to 60%, spray-developing even of 15 μm thick positive dry resists is reliably possible over drilled holes of 1 mm diameter, without tearing of the resist film.

Similar results are obtained when using the polymeric ortho-ester obtained from trimethyl orthoformate and 2-ethyl-2-hydroxymethyl-5-methyl-4-oxa-heptane-1,7-diol.

EXAMPLE 4

A positive photoresist composition, composed of 76 parts by weight of the solvent mixture as in Example 1,
- 13.6 parts by weight of the novolak as in Example 1,
- 6.6 parts by weight of 1,3-bis-[2-(5-ethyl-5-butyl-1,3-dioxacyclohexoxy)]-2-ethyl-2-butyl-propane,
- 1.1 parts by weight of the triazine indicated in Example 2, and
- 2.7 parts by weight of polyvinyl ethyl ether (Lutanol A 25)

is used, as in Example 1, for applying fine circuit patterns to silicon wafers.

After spin-coating with this solution at 6,000 rpm and further drying in a circulating air oven, a positively pre-sensitized wafer is obtained which is stable on storage and the light sensitivity of which is several times greater than that of commercially available positive photoresist layers of the same thickness, based on o-naphthoquinone-diazide. In a comparison with the AZ 1350 J photoresist, which is widely used in microelectronics and is based on o-quinone-diazides, 3 seconds are required for the non-diazo layer and 20 seconds are required for the diazo layer when copying was carried out as in Example 1, but with the interposition of a filter which lenghtens the exposure times. Both these exposure times are optimized for good resolution down to about field 3/2 of the ITEK test original, when developed for 1 minute in the developer solution indicated in Example 1.

The plasma-etching behavior of both layers was also investigated, in each case for 30 minutes at 120° C., without and with baking of the copied wafers. When the plasma-etching is taken up to the maximum temperature of 230° C., 80 nm of SiO$_2$ being etched away in 10 minutes, the baked test patterns are almost identical. Under these conditions, the unbaked patterns display a significant attack on the coating and a corresponding broadening of the etched lines.

When the polyvinyl ethyl ether is omitted from the above coating solution and a layer of the same thickness is prepared on the wafer at a lower rotational speed, the copying properties obtained are poorer, since the layer is less homogeneous and some of the edges have a torn appearance. On baking, the layer profile of this comparison layer deteriorates further due to deformation, and the worst result is obtained on plasma-etching. Altogether, the layer described in this example is the best in respect of suitability for plasma-etching, resolution and light-sensitivity.

EXAMPLE 5

For the manufacture of positive photoresist compositions for the preparation of autotype copper gravure printing cylinders, the following ingredients are dissolved, with stirring, in a mixture of 1,1,1-trichloroethane, n-butyl acetate and ethylene glycol monoethyl ether-acetate (5:3:2) to give solutions of 100 parts by weight total in each case:

10 parts by weight of the novolak as in Example 1,
3 parts by weight of 1,8-bis-(3,4-dihydronaphth-2-yloxy)-3,6-dioxa-octane,
0.25 part by weight of 2-(acenaphth-5-yl)-4,6-bis-trichloromethyl-s-triazine,
0.1 part by weight of crystal violet base, and either
  (1) 2 parts by weight of a colophony resin esterified with pentaerythritol (Resin B-106) or
  (2) 5 parts by weight of the glycerol ester of partially hydrogenated root resin (Staybelite Ester 5)
or
  (3) 4 parts by weight of the glycerol ester of partially hydrogenated colophony (Staybelite Ester 610) (all these products were obtained from Hercules Inc.).

One quarter of a freshly copper-plated rotary copper cylinder is in each case coated, using a spray gun, to a thickness of about 3 μm with the three photoresist compositions provided with the additive resin 1, 2 or 3, and with a comparison solution without an additive resin, and the layers are dried by means of warm air or infrared radiators. Subsequently, the layers are exposed under a screened negative of the motif to be printed, and the copper surface is bared imagewise by pouring 0.8% strength sodium hydroxide solution onto the slowly rotating cylinder; in the case of these layers, this process is completed within 2–4 minutes. Subsequently, the cylinder is rinsed with water and dried by further rotation in warm air.

Before the conventional intaglio etching with ferric chloride solution, retouching is carried out on the four layer portions which are to be compared, by mechanically putting in markings and additional lines, using a stylus for correction. This is achieved most simply and cleanly, that is to say, with the smoothest edges and without fine spalling of the etch resists, in the case of the third layer variant, followed by layers 1 and 2. The comparison layer is relatively the most brittle and, after etching, displayed the most extensive undercutting of the gravure cell walls.

EXAMPLE 6

This example demonstrates the improvement in the oleophilic character and in the resistance to developer of an offset printing form.

A coating solution composed of
7 parts by weight of a modified phenol/formaldehyde novolak (prepared from 140 parts by weight of a novolak and 6.5 parts by weight of the addition product obtained from 3 moles of a tolylene diisocyanate and 1 mole of trimethylolpropane),
2 parts by weight of 2-(naphth-2-yloxy)-5,5-dimethyl-1,3-oxazolin-4-one,
0.4 part by weight of 2-(4-methoxy-anthrac-1-yl)-4,6-bis-trichloromethyl-s-triazine, and
0.1 part by weight of 4-diethylamino-azobenzene
in
90.8 parts by weight of a solvent mixture composed of tetrahydrofuran, ethylene glycol monomethyl ether and butyl acetate (5:4:1)
is applied to aluminum which has been wire-brushed on one side.

The thickness of the layer obtained corresponds to a layer weight of 2 g/m$^2$.

After drying, the coated aluminum is exposed under a positive original, developed with a 3.5% strength aqueous solution of trisodium phosphate, the pH of the solution having been adjusted to 12.6 by the addition of sodium hydroxide, and is then rinsed with water and finally made ready for printing by wiping with 1% strength phosphoric acid. Even if the plate is left lying in the developer solution for 12 times the period sufficient for developing, there is virtually no damage to the image areas. Subsequently, such a plate is used for printing, and it makes up the printing ink very rapidly, in fact more rapidly than a corresponding printing plate prepared with only unmodified phenol/formaldehyde novolak. The quality of the surface of the printing plate after baking of the printing form at 230° C. is likewise better. Similar results are obtained when, instead of the modified resin indicated, 6 parts by weight of the condensation product obtained from 5 parts by weight of octadecyl isocyanate and 100 parts by weight of the same novolak are used.

EXAMPLE 7

This example describes the preparation of a rotary nickel stencil for textile printing and wallpaper printing by electroplating.

An approximately 25 μm thick layer of the following composition:
35% of novolak
25% of the condensation product obtained from 187 parts by weight of phenol/formaldehyde novolak and 6.5 parts by weight of the isocyanate addition product indicated in Example 6,
15% of polyvinyl methyl ether (Lutonal M 40),
24% of N-diphenoxymethyl-ε-amino-caprolactam,
1% of the triazine indicated in Example 5,
and
0.1% of crystal violet base
is applied by 3-fold spray-coating with intermediate drying to a bright nickel cylinder which is slightly contractible and has been provided with a conductive separating layer.

The coated cylinder is adequately exposed under a positive of the motif which is to be printed and the tone gradations of which have been converted, in the conventional manner by means of a screen of 32 lines per cm, into image portions of different dot size. Five times this exposure time is required for a positive layer having half the thickness when it is based on naphthoquinonediazides. Developing is carried out with a solution of
0.5% of sodium hydroxide,
0.8% of sodium metasilicate×9H$_2$O and
1.0% of ethylene glycol mono-n-butyl ether in
97.7% of fully desalinated water.
This is effected by immersing the rotating exposed cylinder in a trough of appropriate size, which is half-filled with developer. The resistance of the layer to developer is very good, giving steep flanks of the resist edges.

After about 6 minutes rotation of the cylinder in the developer, the developer trough is pulled away, and the cylinder is rinsed with water and dried in air.

Since, compared with diazo layers, the resist used is not only relatively thick, but also has good adhesion and is elastic and not brittle, the register seam, which is formed on exposure of the round cylinder by the abutting or overlapping of the film, can be retouched mechanically by means of a stylus or a fine drill comparatively easy, safely and therefore substantially more rapidly.

An elastic rotary printing form is obtained by galvanic deposition of nickel up to about 0.1 mm thickness, contraction of the cylinder core, stripping of the resist with acetone or 5–10% strength sodium hydroxide solution and peeling it off the core. It is possible to transfer ink imagewise to the materials to be printed through the holes having a slight conical taper. Since thicker layers are thus possible, smaller holes, that is to say lighter image dots, can be better protected from filling up, and the tone range can thus be widened.

A similar result with respect to adhesion and mechanical properties of thick layers is obtained when, instead of the polyvinyl methyl ether, approximately the same percentage of hydrogenated methyl ester of colophony is used. The development in this case takes about ⅓ as long again, and this is compensated for by the use of a developer of somewhat higher concentration. In place of the amide-acetal which can be split by acid, 1,2,6-tris-(3,4-dihydro-naphth-1-yloxy)hexane can also be used.

EXAMPLE 8

An aluminum plate of electrolytically roughened and anodized aluminum, which has been pretreated with polyvinylphosphonic acid, is provided with a 2.2 μm thick layer of
- 2 parts by weight of the novolak as in Example 1,
- 0.4 part by weight of the polymeric orthoester obtained from trimethyl orthoformate and 2-methyl-2-hydroxy-methyl-4-oxa-octanediol, molecular weight 2,580,
- 0.13 part by weight of 2-[4-(2-ethoxy-ethoxy)naphth-1-yl]-4,6-bis-trichloromethyl-s-triazine,
- 0.007 part by weight of crystal violet base, and
- 0.2 part by weight of polybutyl acrylate (Plexisol D 592).

This layer is irradiated imagewise with an argon ion laser at 10 mJ/cm² in a laser irradiation apparatus (Laserite ®150 R from Eocom Corp.). The exposed layer portions are removed within 12 minutes, using a developer containing
- 5.5 parts by weight of sodium metasilicate×9H₂O,
- 3.4 parts by weight of trisodium phosphate×12H₂O,
- 0.4 part by weight of monosodium phosphate (anhydrous), and
- 90.7 parts by weight of fully desalinated water.

It is possible to make the image stand out even more clearly by inking the non-irradiated areas with greasy ink.

When the printing plate is directly compared with an otherwise identical printing plate which does not contain any polybutyl acrylate, the following differences are found. Although the additive resin somewhat slows down the speed of developing, it improves the quality of the coating and the uptake of ink. The main advantage is an increase of more than 50% in the obtainable length of run, whereby a highly sensitive printing plate, which can be provided with an image by means of a laser, becomes available for a range of runs of more than 100,000. Similar results are obtained when the polycondensation product prepared from trimethyl orthoformate and 1,2,6-hexanetriol is used as the compound which can be split by acid. Without a substantial change in the advantages achieved, it is possible to replace up to 50% of the additive resin by a copolymer based on butyl methacrylate and methyl methacrylate (Plexisol PM 709) or by a polyisobutyl vinyl ether (Lutonal I 60) of low viscosity.

EXAMPLE 9

To produce a positive dry resist for etch-resists and galvano-resists, the following solution is prepared:
- 57 parts by weight of methyl ethyl ketone,
- 20 parts by weight of the novolak as in Example 1,
- 10 parts by weight of the modified novolak indicated in Example 7,
- 4.5 parts by weight of the bis-(5-ethyl-5-methoxymethyl-1,3-dioxan-2-yl) ether of 2-ethyl-2-methoxymethyl-1,3-propanediol,
- 4.0 parts by weight of 1,3-propanediol bis-(3,4-dihydro-naphth-2-yl)ether,
- 0.2 part by weight of the triazine indicated in Example 2,
- 0.05 part by weight of crystal violet base, and
- 4.2 parts by weight of a polyurethane obtained from a diisocyanate and an aromatic polyester (Estane 5715 from Goodrich Co.).

A biaxially stretched and thermofixed, 25 μm thick polyethylene terephthalate film is coated with this solution, dried and laminated with a 12 μm thick polypropylene cover film, in such a way that uniformly thick resist layer is formed between the two films.

For the manufacture of contact springs for switches, bright brass plates are coated on both sides with this resist, from which the cover film has been peeled off, in a commercially available laminator, under the action of pressure and heat. After cooling, peeling off the support films and brief further drying in a drying cabinet (80° C.), the coated workpiece is sufficiently exposed on both sides under a pair of congruent originals in the form of a pouch. Spray-developing is then carried out on both sides with the developer mentioned in Example 2, and after residues of the alkaline developer have been rinsed off, the wet plates are etched on both sides with a commercially available ferric chloride solution until they are etched through so as to give smooth shoulders.

Before separating, the etched components thus prepared, for baring and gold-plating of the contact ends, are exposed under the corresponding original, developed and finally electrogoldplated thinly in the bared areas. Subsequently, these switch components are bent into the correct shape and installed. Because of the good adhesion and flexibility of this layer, in particular due to the two added, readily compatible polyurethane resins, the resist is able to remain as an insulating layer and protective layer on these contact springs, even after and, in some cases, during the action of heat. Without these additives, the resist cracks off in small pieces after a certain period of resilient stress. Furthermore, the separability from the polyester support film after lamination is improved to such an extent that it is possible to omit the hydrophilic pretreatment of the polyester film.

EXAMPLE 10

A 0.7 μm thick layer of the following composition:

52 parts by weight of the novolak as in Example 1,
21 parts by weight of the condensation product obtained from 144 parts by weight of phenol/formaldehyde novolak and 4.6 parts by weight of tris-(4-isocyanatophenyl)thionophosphate, and
27 parts by weight of the polymeric orthoester obtained from trimethyl orthoformate and 2-chloromethyl-2-hydroxymethyl-4-oxa-1,8-octanediol is spin-coated onto an oxidized silicon wafer.

Imaging can be effected by electron beams, without a starter having to be added, since the polyorthoester, which can be split by acid, itself contains detachable chlorine in a chloromethyl group. This resin combination at the same time provides high resolution and thermal stability (dimensional stability).

Imaging is carried out by irradiation with 11 keV electrons at an energy of about $3 \times 10^{-2}$ J/cm$^2$.

After 60 seconds development with the developer solution of Example 1, it is possible to remove the irradiated layer portions. Both in plasma-etching and in etching with hydrofluoric acid, this layer shows less lateral attack on the layer than a corresponding resist which does not contain any modified novolak but contains 73 parts of novolak. For high-temperature plasma-etching, both layers are simultaneously baked for 30 minutes at 120° C. during which the flanks of the highly-resolving electron beam resist described above are flattened to a markedly smaller extent.

If the irradiation is carried out at an energy of at least 0.5 joule/cm$^2$, the organic resist materials are thoroughly decomposed and crosslinked. A negative image is formed, when the non-irradiated portions are removed by means of solvents or by exposure without an original and developing with the developer of Example 1.

EXAMPLE 11

Highly light-sensitive positive color proofing films are prepared, for example, for checking the mounting in multi-color offset printing. The copying layers have the following composition:
  47 parts by weight of the novolak as in Example 1,
  38 parts by weight of a colophony derivative of the alkyd resin type (Neolyn 20 from Hercules Inc.),
  13 parts by weight of 2,2-bis-(4-diphenoxymethoxyphenyl)-propane,
  0.5 part by weight of 2,5-diethoxy-4-(p-tolylthio)-benzene-diazonium hexafluorophosphate, and
  1.5 parts by weight of blue dye Zapon Fast Blue HFL (C.I. 2,880) or
  1.2 parts by weight of red dye Zapon Fast Red BB (C.I. 2.864) or
  2.0 parts by weight of yellow dye Fat Yellow 5 G (C.I. Supplement 572).

The layer thicknesses of between 1 and 3 µm and the quantities of dye are mutually matched in such a way that the red-colored film, the blue-colored film and the yellow-colored film have the same light-sensitivity, that is to say, when both the exposure time and the development time with an aqueous-alkaline developer are the same, they will give the same length of wedge steps on a continuous tone test wedge copied simultaneously. These color proofing films are markedly more resistant to scratching and adhesive tape than comparative color proofing films prepared without the addition of a modified terpene resin.

EXAMPLE 12

A 25 µm thick polyester film is coated with a 70 µm thick positive dry resist layer of the following composition:
  61 parts by weight of a novolak (1:1 mixture of the novolak of Example 1 and a phenol/formaldehyde novolak having a softening range of 110°-120° C.),
  10 parts by weight of polybutyl acrylate as in Example 8,
  6 parts by weight of a polyurethane obtained from a diisocyanate and an aromatic polyester (Estane 5702 from Goodrich),
  22.7 parts by weight of the polyacetal obtained from benzaldehyde and 1,5-pentanediol,
  0.3 part by weight of 2-(5-methyl-6-methoxy-naphth-2-yl)-4,6-bis-trichloromethyl-s-triazine, and
  0.05 part by weight of crystal violet base, and is laminated with a polyethylene cover film.

Using this resist, printed circuit board material of a copper-laminated insulating material is coated in the conventional manner in a laminator and is copied under a corresponding original. Compared with a 12 µm thick positive diazo dry resist which is available on the market and which, for copying, requires about 130 seconds and 1.5 minutes of spray-developing with the developer mentioned in Example 2, this 70 µm thick resist requires only about 60 seconds exposure with a developing time of about 3 minutes. When the Cu surface, lamination conditions, drying, exposure and developing, within 5-10 minutes after exposure, are mutually matched in an optimum manner, 70 µm deep reliefs of excellent edge acuity and form are obtained, with lines hving a line width and spacing of up to about 70 µm being well reproduced. After the usual electroplating steps, the resist is used as a mask for soldering and, for this purpose, it is rendered more heat-resistant and more adhesive by the additive resins.

EXAMPLE 13

For the coating of zinc plates for the manufacture of letter press printing blocks,
  28.5 parts by weight of the novolak as in Example 1,
  10 parts by weight of Staybelite Ester 5 (see Example 5),
  7.5 parts by weight of a polyethyl acrylate of low viscosity,
  10.5 parts by weight of the bis-(5-phenoxy-1,3-dioxan-2-yl)ether of 2-phenoxy-1,3-propanediol,
  2.2 parts by weight of the triazine indicated in Example 8, and
  0.3 part by weight of Zapon Fast Violet BE (C.I. 12,196)
are dissolved in 41 parts by weight of ethylene glycol monoethyl ether.

A liquid curtain of this coating solution is produced by continuously pumping it around through a coater gap, and degreased zinc plates which have been chemically roughened by superficial washing with 0.5% strength nitric acid, are pushed through this coater gap and are thus coated. After drying of the layer which is adjusted to a weight of 2.9 g/m$^2$ by setting the coater curtain and the speed of transport of the plates, the resulting highly light-sensitive pre-sensitized positive zinc etching plate is exposed under a positive original of an autotype with a screen of 44 lines per cm and is developed in the manner usual in process work. For this purpose, using the developer of Example 7, the exposed layer is incipiently swollen in a dish, a tray or a continuous apparatus, and subsequently mechanically removed, in the simplest case by wiping with a dabber.

After removal of the exposed layer portions by the developing, a violet-blue resist image is present on the metallic-white zinc, and this is processed to give a letter press printing plate by etching with nitric acid, with the addition of edge-protecting agents, in an appropriate machine for powderless etching. The most advantageous etching depth corresponding to the screen is reached after about 5 minutes. For correction of the tone, in particular in the case of multicolor etching, it is possible to carry out a further etching step. The block is directly suitable for the printing of many images and for the preparation of mats. Since the resist layer is still light-sensitive, it can be copied and etched once more, in spite of the etching which has already been carried out, for example, for inserting negative lettering. Furthermore, it is possible, in the case of thicknesses of less than 1.75 mm, to bend the zinc etching plate into round shapes. This is possible even if the layer is to be baked e.g., for 5-15 minutes 100°-100° C., in order to obtain greater stability on printing. Due to the added resins and the particular blend thereof, it has improved adhesion, flexibility and etch resistance under these conditions.

EXAMPLE 14

An 18 μm thick positive dry resist layer of the following composition:

54 parts by weight of the novolak as in Example 1,
21 parts by weight of the modified terpene resin as in Example 11,
8.5 parts by weight of polyvinyl ethyl ether,
8 parts by weight of a polymeric ortho-ester, prepared from trimethyl orthoformate and a mixture of 2-ethyl-5-methyl-2-hydroxymethyl-4-oxa-1,7-heptanediol and 2-ethyl-2-hyroxymethyl-4-oxa-1,7-octanediol,
8 parts by weight of the polyacetal obtained from diethylene glycol divinyl ether and cyclohexane-1,4-diol,
0.45 part by weight of the triazine indicated in Example 12, and
0.05 part by weight of crystal violet base is coated on a 25 μm thick polyester film and laminated with a polyolefin film.

This is used for coating, by lamination, of ceramic or glass substrates which are used for microwave circuitry, hybrid components or displays, in most cases in a size of 10×10 cm, and which are of the following types: aluminum oxide thinly coated with metal ($Al_2O_3/Al$, $Al_2O_3/Ti$ or $Al_2O_3/Ti/Ni/Au$) or glass/Cr, glass/Ni, glass/Sn-In oxide or glass/Sn-In oxide/Cu.

On all these supports, this layer combination has good adhesion on lamination without preheating of the substrates and it gives clean sharp-edged copies and shows resistance to various etching and electroplating processes. The copying and etching of copper, both with iron-III-chloride and with copper-II chloride etching solution, can be repeated several times. This layer even withstands etching of the conductive transparent Sn-In oxide layer with strong hydrochloric acid at 60° C., after which, surprisingly, second copying is still possible.

What is claimed is:

1. A positive-working radiation-sensitive mixture, comprising:

a compound having at least one C—O—C bond which can be split by acid, said compound being selected from an orthocarboxylic acid derivative and a polyacetal;

a compound which forms a strong acid when radiated;

from 20 to 90% by weight, relative to the non-volatile constituents of the mixture, of a binder which is insoluble in water and soluble in an aqueous-alkaline solution;

and from 1 to 50% by weight, relative to the non-volatile constituents of the mixture, of at least two resinous materials having solubility properties which differ from those of said binder, said resinous materials comprising a polyvinyl alkyl ether and an alkyl acrylate or methacrylate polymer, or a copolymer thereof.

2. A positive-working radiation-sensitive mixture as claimed in claim 1, wherein said polyacetal comprises a polyacetal wherein each alpha-carbon atom of the alcoholic constituent of the acetal groupings is aliphatic.

3. A radiation-sensitive mixture was claimed in claim 1, wherein said binder comprises a novolak.

4. A radiation-sensitive mixture as claimed in claim 1, wherein said resinous material comprises a polyvinyl lower alkyl ether present in an amount of from about 2-40% by weight of said radiation-sensitive mixture.

5. A radiation-sensitive mixture as claimed in claim 4, wherein said polyvinyl lower alkyl ether comprises polyvinyl methyl ether, polyvinyl ethyl ester or polyvinyl butyl ether.

6. A radiation-sensitive mixture as claimed in claim 1, wherein said resinous material comprises a lower alkyl acrylate or methacrylate polymer or a copolymer thereof present in an amount of from about 1-20% by weight of said radiation-sensitive mixture.

7. A radiation-sensitive mixture as claimed in claim 6, wherein said resinous material comprises a polyethyl acrylate or methacrylate or a polybutyl acrylate or methacrylate.

8. A positive-working radiation-sensitive mixture comprising:

a compound having at least one C—O—C bond which can be split by acid, said compound being selected from an orthocarboxylic acid derivative and a polyacetal, wherein each alpha-carbon atom of the alcoholic constituent of the acetal groupings is aliphatic;

a compound which forms a strong acid when radiated;

from 20 to 90% by weight, relative to the non-volatile constituents of the mixture, of a binder which is insoluble in water and soluble in an aqueous-alkaline solution;

and from 1 to 50% by weight, relative to the non-volatile constituents of the mixture, of at least one resinous material having solubility properties which differ from those of said binder, said resinous materials comprising a polyvinyl alkyl ether, or an alkyl acrylate or methacrylate polymer or a copolymer thereof.

9. A positive-working radiation-sensitive mixture as defined in claim 8, wherein said binder comprises a novolak.

10. A positive-working radiation-sensitive mixture as defined in claim 8, wherein said resinous material comprises a polyvinyl lower alkyl ether present in an amount of from about 2–40% by weight of said radiation-senstive mixture.

11. A positive-working radiation-sensitive mixture as defined in claim 10, wherein said polyvinyl lower alkyl ether comprises polyvinyl methyl ether, polyvinyl ethyl ether or polyvinyl butyl ether.

12. A positive-working radiation-sensitive mixture as defined in claim 8, wherein said resinous material comprises a lower alkyl acrylate or methacrylate polymer or a copolymer thereof present in an amount of from about 1–20% by weight of said radiation-sensitive mixture.

13. A positive-working radiation-sensitive mixture as defined in claim 12, wherein said resinous material comprises a polyethyl acrylate or methacrylate or a polybutyl acrylate or methacrylate.

* * * * *